(12) United States Patent
Adkisson et al.

(10) Patent No.: US 7,633,106 B2
(45) Date of Patent: Dec. 15, 2009

(54) LIGHT SHIELD FOR CMOS IMAGER

(75) Inventors: James W. Adkisson, Jericho, VT (US); Jeffrey P. Gambino, Westford, VT (US); Mark D. Jaffe, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 406 days.

(21) Appl. No.: 11/164,072

(22) Filed: Nov. 9, 2005

(65) Prior Publication Data

US 2007/0102738 A1 May 10, 2007

(51) Int. Cl.
*H01L 31/00* (2006.01)
(52) U.S. Cl. .............................. 257/294; 257/E27.132; 257/72
(58) Field of Classification Search .................. 257/72, 257/292, E27.132, 222, 294; 250/208.1, 250/214.1
See application file for complete search history.

(56) References Cited

U.S. PATENT DOCUMENTS

| | | | |
|---|---|---|---|
| 6,184,055 B1 | 2/2001 | Yang et al. | |
| 6,198,087 B1 | 3/2001 | Boon | |
| 6,235,549 B1 | 5/2001 | Bawolek et al. | |
| 6,278,169 B1 | 8/2001 | Sayuk et al. | |
| 6,316,814 B1 * | 11/2001 | Nagata et al. | 257/435 |
| 6,326,652 B1 * | 12/2001 | Rhodes | 257/231 |
| 6,498,622 B1 | 12/2002 | Nakashiba | |
| 6,570,617 B2 | 5/2003 | Fossum et al. | |
| 6,624,456 B2 | 9/2003 | Fossum et al. | |
| 6,680,498 B2 | 1/2004 | Guidash | |
| 6,774,420 B2 | 8/2004 | Hayashimoto et al. | |
| 6,781,178 B2 | 8/2004 | Shizukuishi | |
| 6,812,539 B1 | 11/2004 | Rhodes | |
| 6,821,809 B2 | 11/2004 | Abe et al. | |
| 6,825,516 B2 | 11/2004 | Rhodes | |
| 6,852,591 B2 | 2/2005 | Rhodes | |
| 6,853,045 B2 | 2/2005 | Rhodes | |
| 6,858,460 B2 | 2/2005 | Rhodes et al. | |
| 7,030,918 B1 * | 4/2006 | Nakashiba | 348/294 |
| 7,045,380 B2 * | 5/2006 | Kim | 438/48 |
| 7,355,222 B2 * | 4/2008 | Wells | 257/222 |
| 7,402,881 B2 * | 7/2008 | Kuwazawa | 257/434 |
| 2004/0012029 A1 | 1/2004 | Bawolek et al. | |
| 2004/0140564 A1 * | 7/2004 | Lee et al. | 257/758 |
| 2004/0201072 A1 | 10/2004 | Rhodes | |
| 2007/0045665 A1 * | 3/2007 | Park | 257/204 |
| 2007/0069248 A1 * | 3/2007 | Ohta | 257/239 |

FOREIGN PATENT DOCUMENTS

EP 0 917 205 A3 5/1999

* cited by examiner

*Primary Examiner*—Jerome Jackson, Jr.
*Assistant Examiner*—Paul A Budd
(74) *Attorney, Agent, or Firm*—Anthony J. Canale; Hoffman Warnick LLC

(57) ABSTRACT

The present invention provides a light shield for shielding the floating diffusion of a complementary metal-oxide semiconductor (CMOS) imager. In accordance with an embodiment of the present invention, there is provided a pixel sensor cell including: a device region formed on a substrate; and a first layer of material forming a sidewall adjacent to a side of the device region for blocking electromagnetic radiation from the device region.

20 Claims, 6 Drawing Sheets

LIGHT SHIELD FOR CMOS IMAGER

BACKGROUND OF THE INVENTION

1. Field of the Invention

The present invention generally relates to integrated circuits. More particularly, the present invention provides a light shield for shielding the floating diffusion of a complementary metal-oxide semiconductor (CMOS) imager.

2. Related Art

Compared to charge coupled device (CCD) imagers, CMOS imagers are less expensive to produce and consume less power. As such, CMOS imagers are increasingly used for a variety of applications including digital cameras and cell phones. However, the signal-to-noise ratio of CMOS imagers must be improved to compete with CCD devices for high resolution applications.

An illustrative pixel sensor cell 10 of a CMOS imager is depicted in FIG. 1. As is known in the art, the pixel sensor cell 10 comprises a photodiode 12 for capturing incident light 14, a floating diffusion FD 16, a transfer gate TG 18 for transferring charge from the photodiode 12 to the floating diffusion 16, a reset gate RG 20 for resetting the floating diffusion 16 to a predetermined potential, and shallow trench isolation (STI) spacers 22 for isolating the components of the pixel sensor cell 10. The pixel sensor cell 10 is formed on a substrate 24. One of the sources of noise is stray light 14' that is incident on the floating diffusion 16 adjacent to the transfer gate 18. This issue becomes critical, for example, for electronic shutter pixels. In electronic shutter pixels, the charge must sit on the floating diffusion 16 for a relatively long time (e.g., up to a large fraction of a second). If any stray light 14' hits the floating diffusion 16 during this time, it changes the image that is read out from the pixel sensor cell 10. Therefore, a light shield is desirable over the floating diffusion 16 to block any stray light 14'.

SUMMARY OF THE INVENTION

The present invention provides a light shield for shielding the floating diffusion of a complementary metal-oxide semiconductor (CMOS) imager. In particular, the present invention provides a light shield comprising at least one sidewall and an M1 (first metallization level) metal shield for substantially enclosing the area around the floating diffusion. The light shield not only prevents electromagnetic radiation (e.g., light) from directly impinging on the floating diffusion, but it also prevents (stray) angled electromagnetic radiation from impinging due to the use of the sidewall. Although the light shield of the present invention will be described below for use with a floating diffusion of a CMOS imager, it will be apparent to one skilled in the art that the light shield can be used to protect light-sensitive areas in many other types of semiconductor devices. Further, although the light shield of the present invention will be described below with regard to a specific configuration of a CMOS imager, it will be apparent to one skilled in the art that the light shield can be used with other types of CMOS imagers.

A first aspect of the present invention is directed to a pixel sensor cell comprising: a device region formed on a substrate; and a first layer of material forming a sidewall adjacent to a side of the device region for blocking electromagnetic radiation from the device region.

A second aspect of the present invention is directed to an integrated circuit, comprising: at least one pixel sensor cell, each pixel sensor cell comprising: a device region formed on a substrate; and a first layer of material forming a sidewall adjacent to a side of the device region for blocking electromagnetic radiation from the device region.

A third aspect of the present invention is directed to a method for shielding a device region of a pixel sensor cell from electromagnetic radiation, comprising: forming a first layer of opaque material adjacent the device region, the first layer of opaque material forming a sidewall; and forming a second layer of opaque material over the device region and the sidewall.

A fourth aspect of the present invention is directed to a method for shielding a floating diffusion of a pixel sensor cell from electromagnetic radiation, comprising: forming a layer of opaque material adjacent the floating diffusion, the layer of opaque material forming a sidewall; and forming a metal layer over the floating diffusion and the sidewall, the metal layer extending in a direction substantially perpendicular to the sidewall.

BRIEF DESCRIPTION OF THE DRAWINGS

These and other features of this invention will be more readily understood from the following detailed description of the various aspects of the invention taken in conjunction with the accompanying drawings in which.

Figure 1:
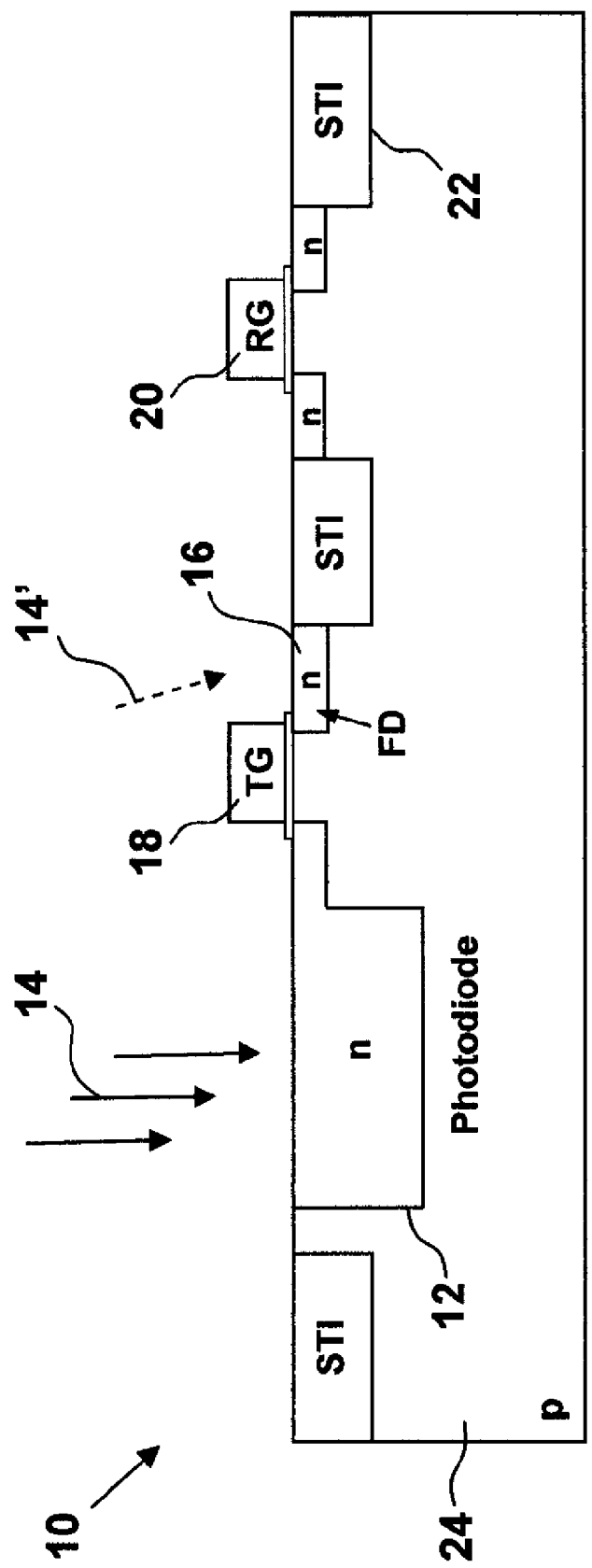
FIG. 1 depicts an illustrative CMOS imager.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

The present invention provides a light shield for shielding the floating diffusion of a complementary metal-oxide semiconductor (CMOS) imager.

Figure 2:
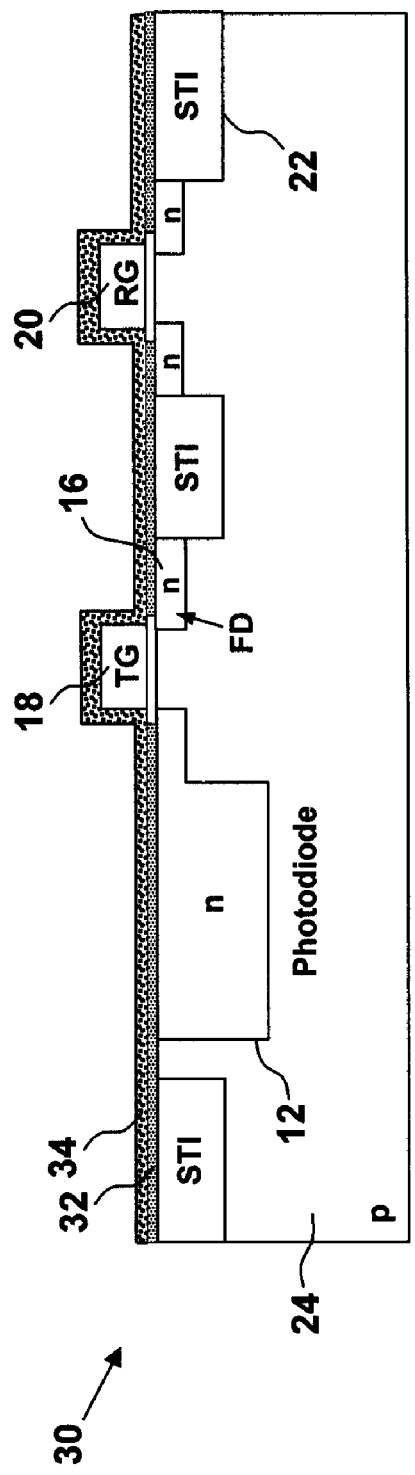
FIGS. 2-9 depict an illustrative process for forming a light shield in accordance with an embodiment of the present invention.

Initially, as shown in FIG. 2, a pixel sensor cell 30 is formed using conventional semiconductor processing techniques. In general, similar to the pixel sensor cell 10 depicted in FIG. 1, the pixel sensor cell 30 comprises a photodiode 12, a floating diffusion FD 16, a transfer gate TG 18 for transferring charge from the photodiode 12 to the floating diffusion 16, a reset gate RG 20 for resetting the floating diffusion 16 to a predetermined potential, and shallow trench isolation (STI) spacers 22 for isolating the components of the pixel sensor cell 30. The pixel sensor cell 30 is formed on a substrate 24 comprising, for example, silicon (Si).

A silicon dioxide ($SiO_2$) layer 32 (or other suitable dielectric such as siliconoxynitride (SiON)) is then deposited, followed by the deposition of a silicon nitride ($Si_3N_4$) layer 34. As known in the art, the $SiO_2$ layer 32 provides a high quality interface with silicon (Si), with low leakage current, while the $Si_3N_4$ layer 34 is used to prevent silicide formation. Deposition of the $SiO_2$ layer 32 and the SiN layer 34 can be provided using any suitable now known or later developed technique, such as chemical vapor deposition (CVD).

Figure 3:
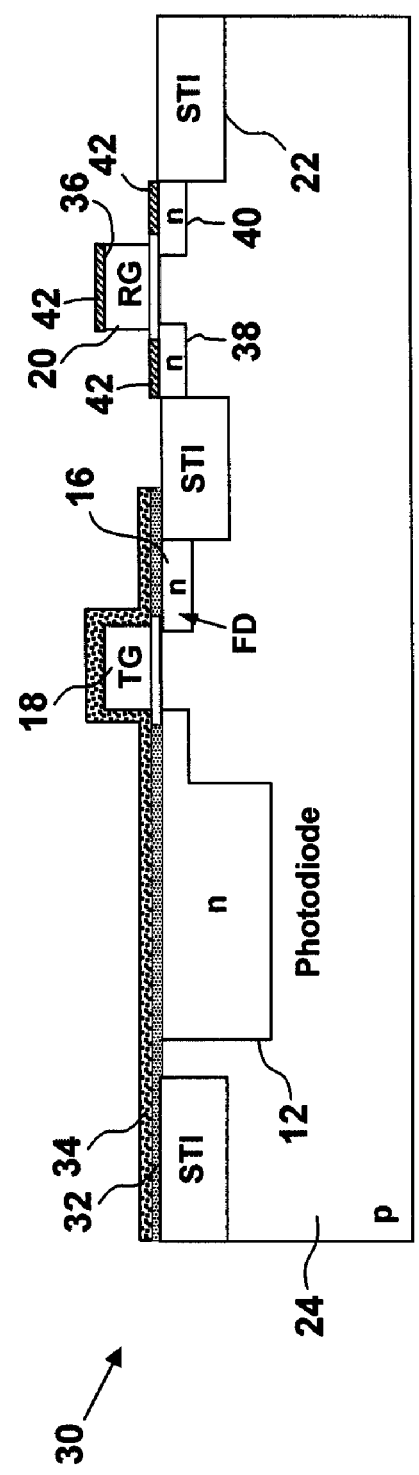

As illustrated in FIG. 3, the $Si_3N_4$ layer 34 and the $SiO_2$ layer 32 are then patterned in the area of the reset gate 20 to expose the surface 36 and the source and drain diffusions 38, 40 of the reset gate 20. Patterning of the $Si_3N_4$ layer 34 and the $SiO_2$ layer 32 can be provided, for example, using lithography and reactive ion etching (RIE). A cobalt silicide ($CoSi_2$) layer 42 for reducing series resistance is then selectively formed on the surface 36 and the source and drain diffusions 38, 40 of the reset gate 20. The $CoSi_2$ layer 42 can be formed using a standard silicide process. Other materials such as titanium silicide ($TiSi_2$), nickel silicide (NiSi), platinum silicide (PtSi), etc., could be used in place of $CoSi_2$ for layer 42.

Figure 4:
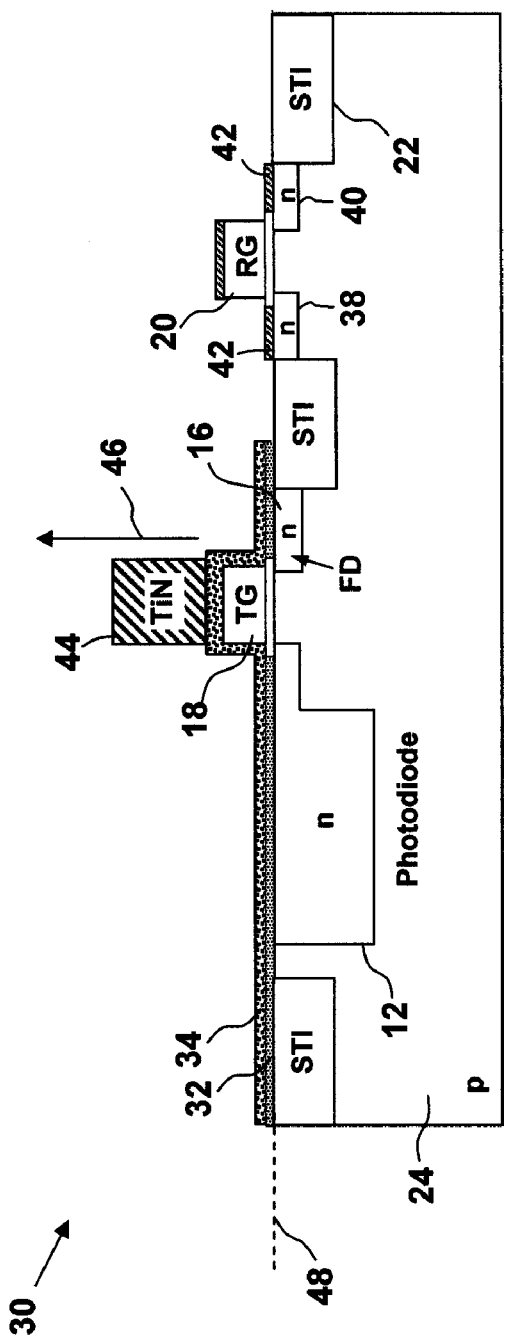

The first step in forming the light shield of the present invention is illustrated in FIG. 4. In particular, a titanium nitride (TiN) layer 44 is deposited and subsequently patterned, such that the TiN layer 44 remains over the transfer gate 18. To this extent, the TiN layer 44 forms an opaque sidewall adjacent a side of a device region (i.e., the floating diffusion 16) of the pixel sensor cell 30. Other suitable opaque materials such as tungsten (W), aluminum (Al), etc., could be used in place of TiN for layer 44. The TiN layer 44 extends substantially in a vertical direction 46 (preferably substantially perpendicular) relative to a top surface 48 of the substrate 24. Alternatively, the TiN layer 44 can be formed such that it is inclined (i.e., at an angle less than 90°) relative to the top surface 48 of the substrate 24. Deposition of the TiN layer 44 can be performed, for example, using sputter deposition, CVD, or other suitable deposition technique. The TiN layer 44 can be patterned, for example, using lithography and RIE. The TiN layer 44 is electrically insulated from the transfer gate 18 by the $Si_3N_4$ layer 34.

Figure 5:
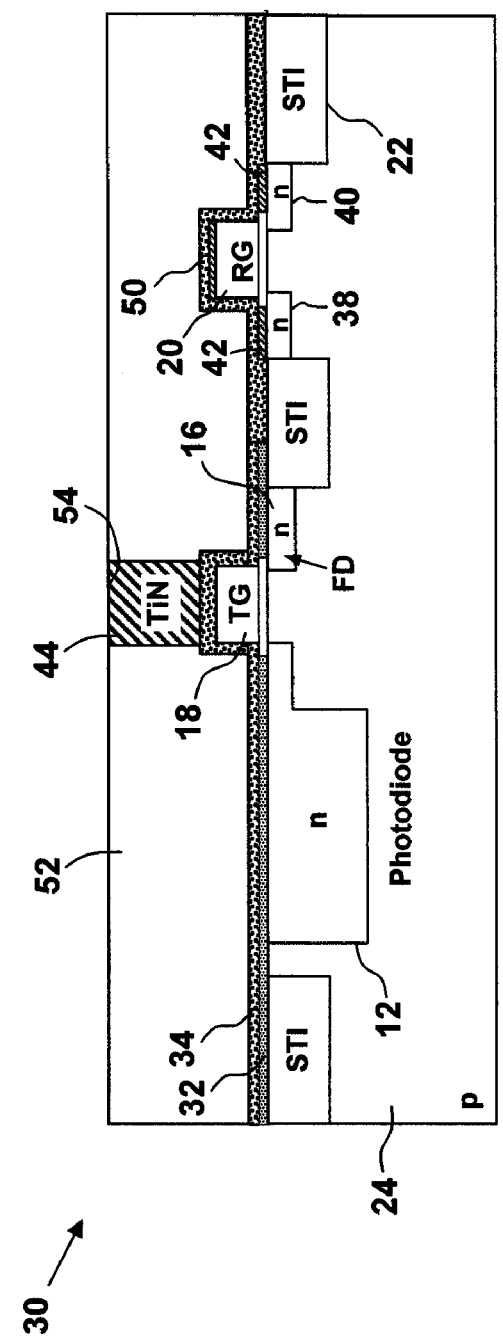

As shown in FIG. 5, a $Si_3N_4$ etch stop layer 50 is then deposited in the area of the reset gate 20. Next, an insulating boron-phosphorous-silicate glass (BPSG) layer 52 is deposited and planarized (e.g., using chemical-mechanical-polishing (CMP)) such that it is coplanar with a top surface 54 of the TiN layer 44. The $Si_3N_4$ layer 50 and the BPSG layer 52 can be deposited, for example, using CVD. Other suitable materials such as $SiO_2$, phosphosilicate glass (PSG), etc., could be used in place of BPSG for layer 52.

Figure 6:
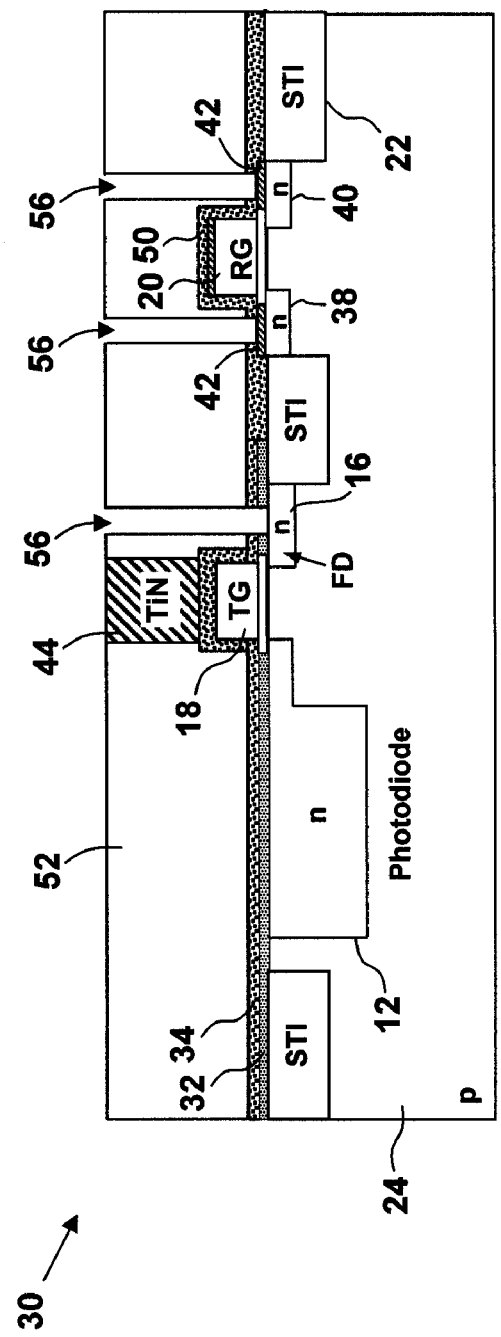
Figure 7:
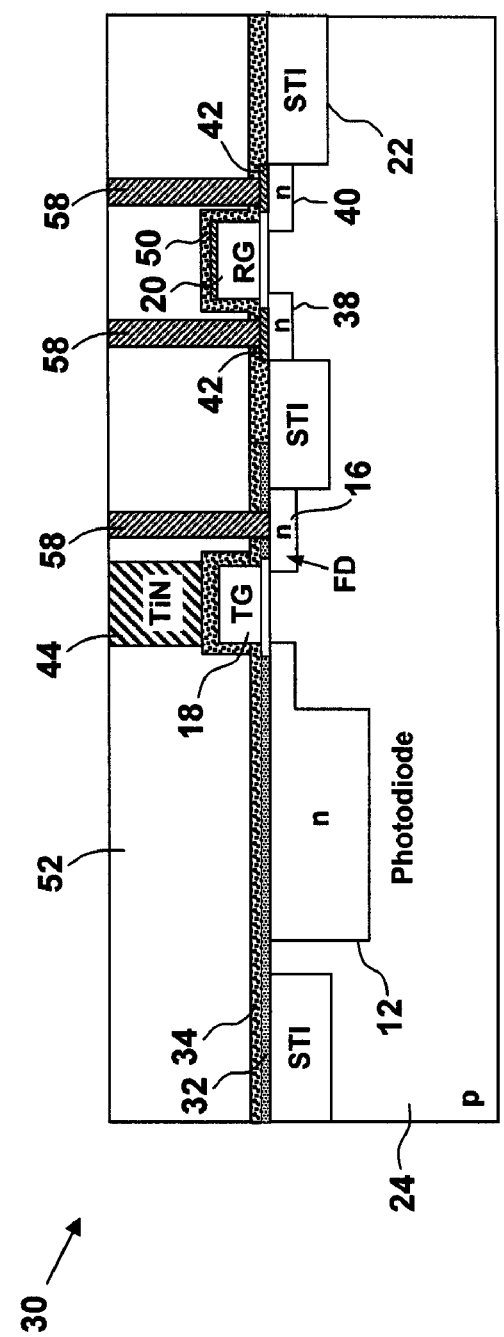

Next, as illustrated in FIG. 6, contact holes 56 are etched (e.g., using lithography and RIE) to the floating diffusion 16 and to the $CoSi_2$ layer 42 on the source and drain diffusions 38, 40 of the reset gate 20. As shown in FIG. 7, a conductive material such as tungsten (W) is then deposited (e.g., using CVD) to fill the contact holes 56. Other suitable conductive materials such as TiN, Al, copper (Cu), doped Si, etc., could be used in place of W to fill the contact holes 56. This is followed by CMP to form contacts 58. As known in the art, a barrier layer (not shown) comprising, for example, titanium (Ti) and TiN, is typically deposited in the contact holes 56 prior to the deposition of W. The use and composition of such a barrier layer is dependent on the material used to fill the contact holes 56.

Figure 8:
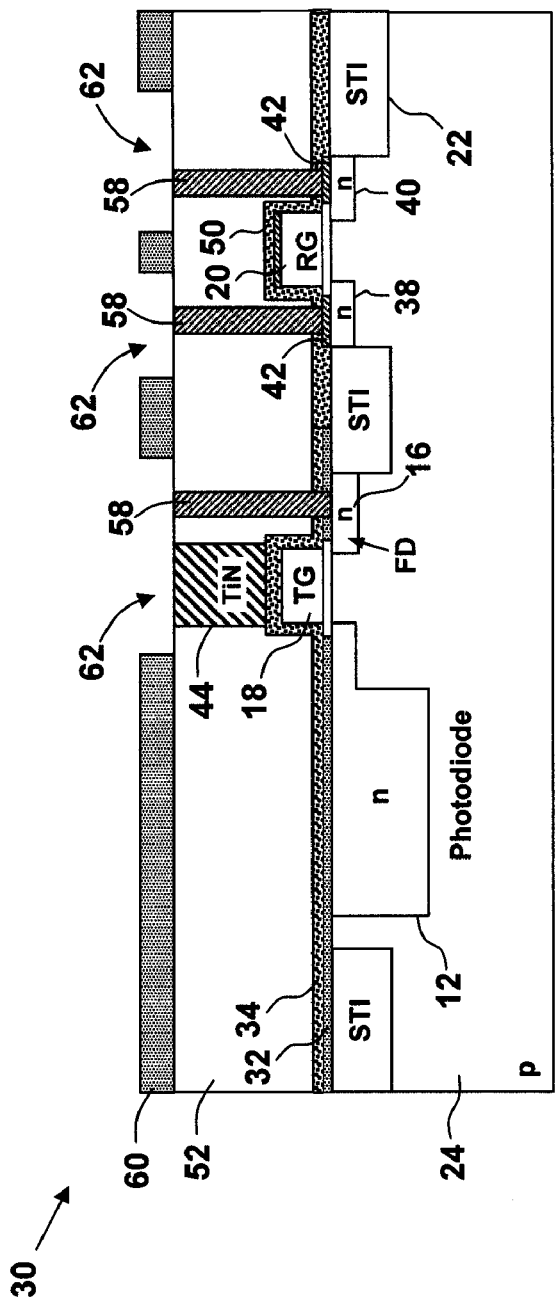
Figure 9:
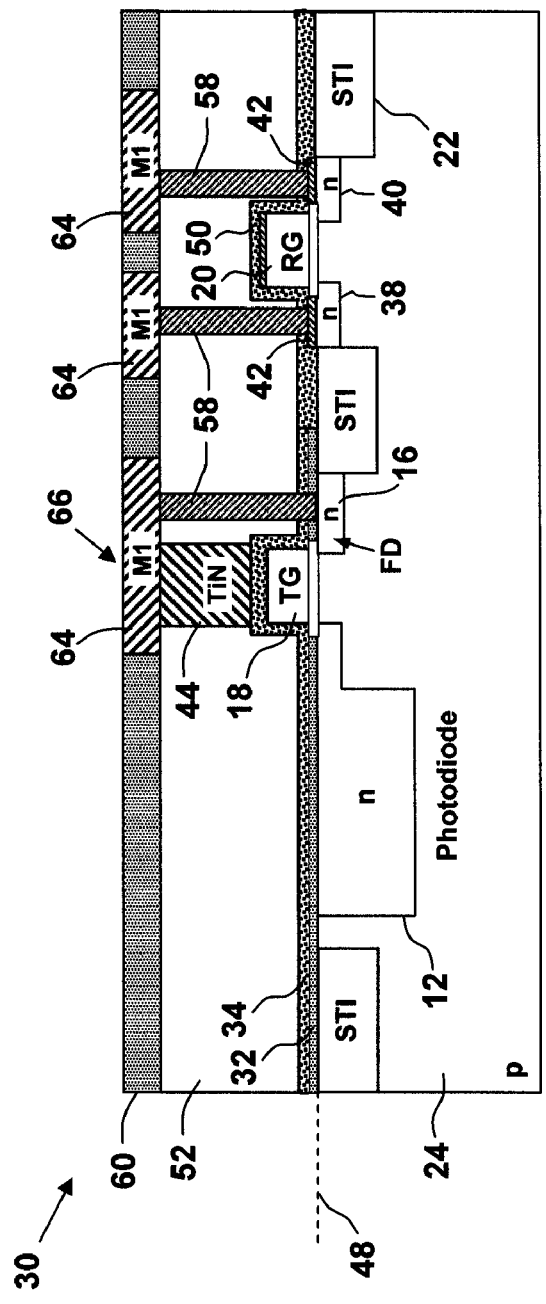

As illustrated in FIG. 8, a $SiO_2$ layer 60 is then deposited (e.g., using CVD or spin-on processing) on the BPSG layer 52 and subsequently patterned (e.g., using lithography and RIE) to completely remove the $SiO_2$ layer 60 in the areas above the TiN layer 44 and the contacts 58, thereby providing openings 62 for an M1 metallization layer. Other suitable materials such as fluorinated silicate glass (FSG), hydrogenated silicon oxycarbide (SiCOH), certain polymers, etc., could be used in place of $SiO_2$ for layer 60. Next, as shown in FIG. 9, a metal layer 64 is deposited (e.g., using sputter deposition, plating, or CVD) and planarized (e.g., using CMP) to form the M1 metallization layer. The metal layer 64 can comprise, for example Cu, W, Al, or silver (Ag). One or more barrier layers (not shown) may be deposited, if necessary, in the openings 62 prior to the deposition of the metal layer 64. The metal layer 64, which is opaque, extends over the floating diffusion 16, substantially parallel to the surface 48 of the substrate 24, thereby forming an opaque "ceiling" over the floating diffusion 16. Together, the TiN layer 44 and the metal layer 64 form a light shield 66 for shielding the floating diffusion 16 from electromagnetic radiation.

Figure 10:
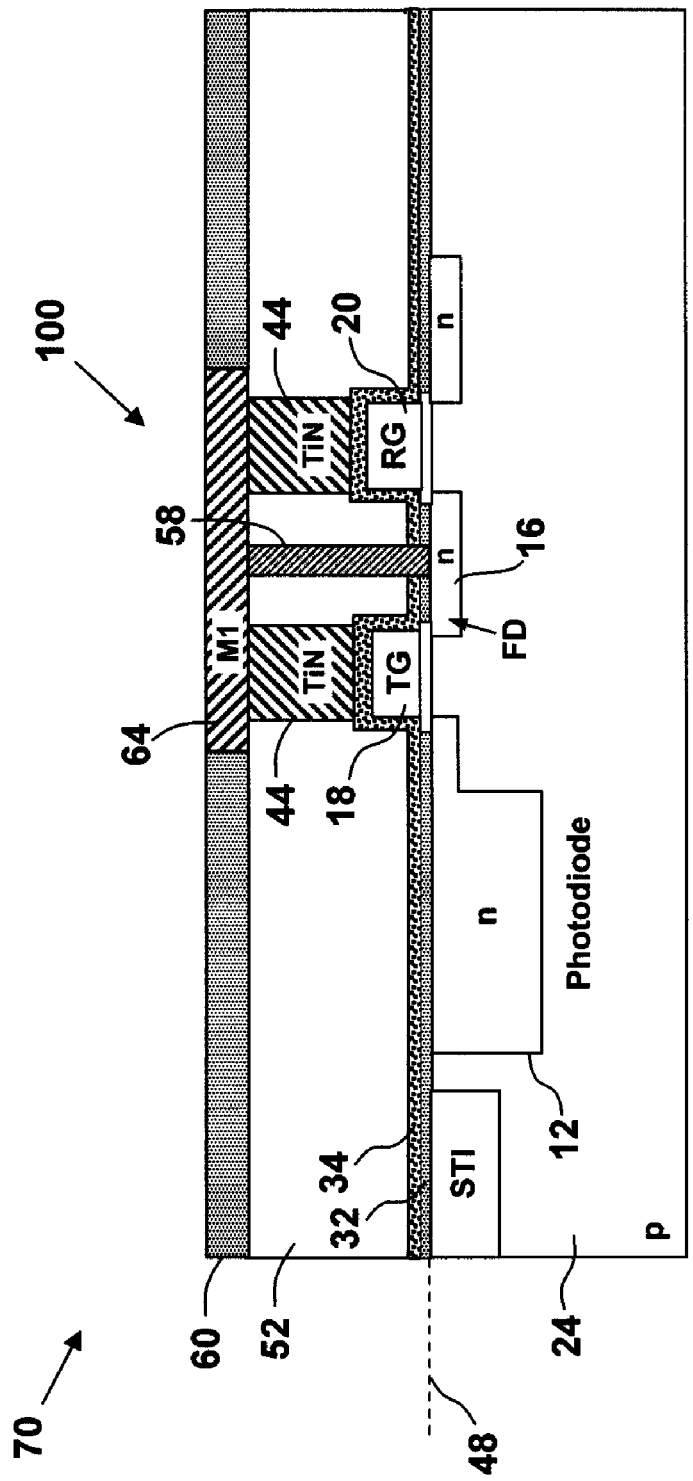
FIG. 10 depicts a full light shield in accordance with an embodiment of the present invention.

A different layout of a pixel sensor cell 70 is illustrated in FIG. 10. Comparing FIGS. 9 and 10, it can be seen that in the pixel sensor cell 30 of FIG. 9, the floating diffusion 16 is separate from the reset gate 20, whereas in the pixel sensor cell 70 of FIG. 10 the floating diffusion 16 is part of the reset gate 20 (i.e., the floating diffusion 16 is used by both the transfer gate 18 and the reset gate 20 in the pixel sensor cell 70). To this extent, a full light shield 100 can be formed to at least partially enclose the floating diffusion 16. In particular, in this embodiment of the present invention, the TiN layer 44 is also formed over the reset gate 20, thereby forming an additional sidewall adjacent the floating diffusion 16. Thus, the floating diffusion 16 is at least partially surrounded by the TiN layer 44. The metal layer 64 extends over the floating diffusion 16 and the TiN layer 44 substantially parallel to the surface 48 of the substrate 24 to form a ceiling over the floating diffusion 16. As such, the TiN layer 44 and metal layer 64 of the full light shield 100 prevent electromagnetic radiation from impinging on the floating diffusion 16.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A pixel sensor cell comprising:
   a device region formed on a substrate, wherein the device region comprises a floating diffusion;
   a first layer of an opaque material forming a sidewall adjacent to a side of the device region for blocking electromagnetic radiation from the device region, wherein the first layer of material is formed over a transfer gate of the pixel sensor cell, wherein the first layer of material does not extend over the device region and is substantially perpendicular to a surface of the substrate;
   a second layer of material for blocking electromagnetic radiation from the device region, the second layer of material being in direct contact with the first layer of material and formed over the device region and the first layer of material, and oriented substantially perpendicular to a surface of the first layer of material; and
   a third layer of material for blocking electromagnetic radiation from the device region, the third layer of material formed of the same opaque material as the first layer, the third layer in direct contact with the second layer of material and oriented substantially parallel with the surface of the first layer of material, wherein the third layer of material is formed directly over a reset gate of the pixel sensor cell and does not extend over the device region.

2. The pixel sensor cell of claim 1, wherein the second layer of material comprises an opaque material.

3. The pixel sensor cell of claim 1, wherein the second layer of material comprises a metal.

4. The pixel sensor cell of claim 1, wherein the second layer of material comprises a metallization layer.

5. The pixel sensor cell of claim 1, wherein the first and second layers of material at least partially enclose the device region.

6. The pixel sensor cell of claim 1, wherein the first layer of material at least partially surrounds the device region.

7. The pixel sensor cell of claim 1, wherein the pixel sensor cell forms a portion of a complementary metal-oxide semiconductor (CMOS) imager.

8. The pixel sensor cell of claim 1, wherein the first layer and the third layer extend in the same direction from the second layer.

9. The pixel sensor cell of claim 1, further comprising a contact layer located between the first layer and the third layer, the contact layer abutting a portion of the second layer and a portion of the floating diffusion.

10. The pixel sensor of claim 1, wherein the second layer includes an opaque material distinct from the opaque material of the first layer and the third layer.

11. An integrated circuit, comprising:
   at least one pixel sensor cell, each pixel sensor cell comprising:
      a device region formed on a substrate, wherein the device region comprises a floating diffusion;
      a first layer of an opaque material forming a sidewall adjacent to a side of the device region for blocking electromagnetic radiation from the device region, wherein the first layer of material is formed over a transfer gate of the pixel sensor cell, wherein the first layer of material does not extend over the device region and is substantially perpendicular to a surface of the substrate;
      a second layer of material for blocking electromagnetic radiation from the device region, the second layer of material being in direct contact with the first layer of material and formed over the device region and the first layer of material, and oriented substantially perpendicular to a surface of the first layer of material; and
      a third layer of material for blocking electromagnetic radiation from the device region, the third layer of material formed of the same opaque material as the first layer, the third layer in direct contact with the second layer of material and oriented substantially parallel with the surface of the first layer of material, wherein the third layer of material is formed directly over a reset gate of the pixel sensor cell and does not extend over the device region.

12. The integrated circuit of claim 11, wherein the second layer of material comprises an opaque material.

13. The integrated circuit of claim 11, wherein the second layer of material comprises a metal.

14. The integrated circuit of claim 11, wherein the second layer of material comprises a metallization layer.

15. The integrated circuit of claim 11, wherein the first and second layers at least partially enclose the device region.

16. The integrated circuit of claim 11, wherein the first layer of material at least partially surrounds the device region.

17. The integrated circuit of claim 11, wherein the pixel sensor cell forms a portion of a complementary metal-oxide semiconductor (CMOS) imager.

18. The pixel sensor cell of claim 11, wherein the first layer and the third layer extend in the same direction from the second layer.

19. The pixel sensor cell of claim 11, further comprising a contact layer located between the first layer and the third layer, the contact layer abutting a portion of the second layer and a portion of the floating diffusion.

20. The pixel sensor of claim 11, wherein the second layer includes an opaque material distinct from the opaque material of the first layer and the third layer.

* * * * *